United States Patent [19]

Magdo et al.

[11] Patent Number: 4,805,683

[45] Date of Patent: Feb. 21, 1989

[54] METHOD FOR PRODUCING A PLURALITY OF LAYERS OF METALLURGY

[75] Inventors: Ingrid E. Magdo, Hopewell Junction; Douglas W. Ormond, Jr., Wappingers Falls, both of N.Y.

[73] Assignee: International Business Machines Corporation, Armonk, N.Y.

[21] Appl. No.: 164,363

[22] Filed: Mar. 4, 1988

[51] Int. Cl.[4] .......................... B44C 1/22; C23F 1/02; C03C 15/00; C03C 25/06
[52] U.S. Cl. ................................. 156/643; 156/646; 156/652; 156/653; 156/656; 156/657; 156/659.1; 156/661.1; 156/668; 204/192.35; 204/192.37; 437/228
[58] Field of Search ................ 156/643, 646, 653, 656, 156/657, 659.1, 661.1, 668, 652; 204/192.3, 192.32, 192.35, 192.37; 427/38, 39; 252/79.1; 428/621; 437/228, 238, 245

[56] References Cited

U.S. PATENT DOCUMENTS

| | | | |
|---|---|---|---|
| 4,092,442 | 5/1978 | Agnihotri et al. | 427/41 |
| 4,206,254 | 6/1980 | Schmeckenbecher | 427/259 |
| 4,221,047 | 9/1980 | Narken et al. | 29/840 |
| 4,301,324 | 11/1981 | Kumar et al. | 174/68.5 |
| 4,413,061 | 11/1983 | Kumar et al. | 501/7 |
| 4,526,859 | 7/1985 | Christensen et al. | 430/314 |

OTHER PUBLICATIONS

"Process for Forming Copper Studs for Metallurgy Systems" by P. M. Schaible et al., IBM Technical Disclosure Bulletin, vol. 27, No. 6, Nov. 1984, pp. 3341–3342.

"Packaging Substrate with Top Surface Metallurgy Adapted for Mixed Technology Device Bonding and Method" by C. R. Fedorko, Jr., et al., IBM Technical Disclosure Bulletin, vol. 26, No. 12, May 1984, p. 6624.

*Primary Examiner*—William A. Powell
*Attorney, Agent, or Firm*—Ira David Blecker

[57] ABSTRACT

A method for selectively depositing a plurality of metal layers on a substrate. The method includes the steps of depositing at least one layer of blanket metal on a surface of a substrate, building a lift-off stencil over the blanket metal, depositing at least one layer of redundant metal over the lift-off stencil, depositing a first etch-resistant barrier over the redundant metal, removing the lift-off stencil and the overlying layers of redundant metal and the etch-resistant barrier, depositing a second etch-resistant barrier over the blanket metal and the first etch-resistant barrier, and then reactive ion etching (RIE) the second etch-resistant barrier so as to expose the blanket metal and at least partially remove the second etch-resistant barrier from the first etch-resistant barrier. A final step of the method includes etching the blanket metal. Also disclosed is a metallurgical structure for a packaging substrate. The metallurgical structure includes layers of blanket metal and redundant metal. The redundant metal has an electrically isolating coating on its side but not on its top surface, thereby facilitating the electrical contact of the redundant metal with an electrical component.

14 Claims, 4 Drawing Sheets

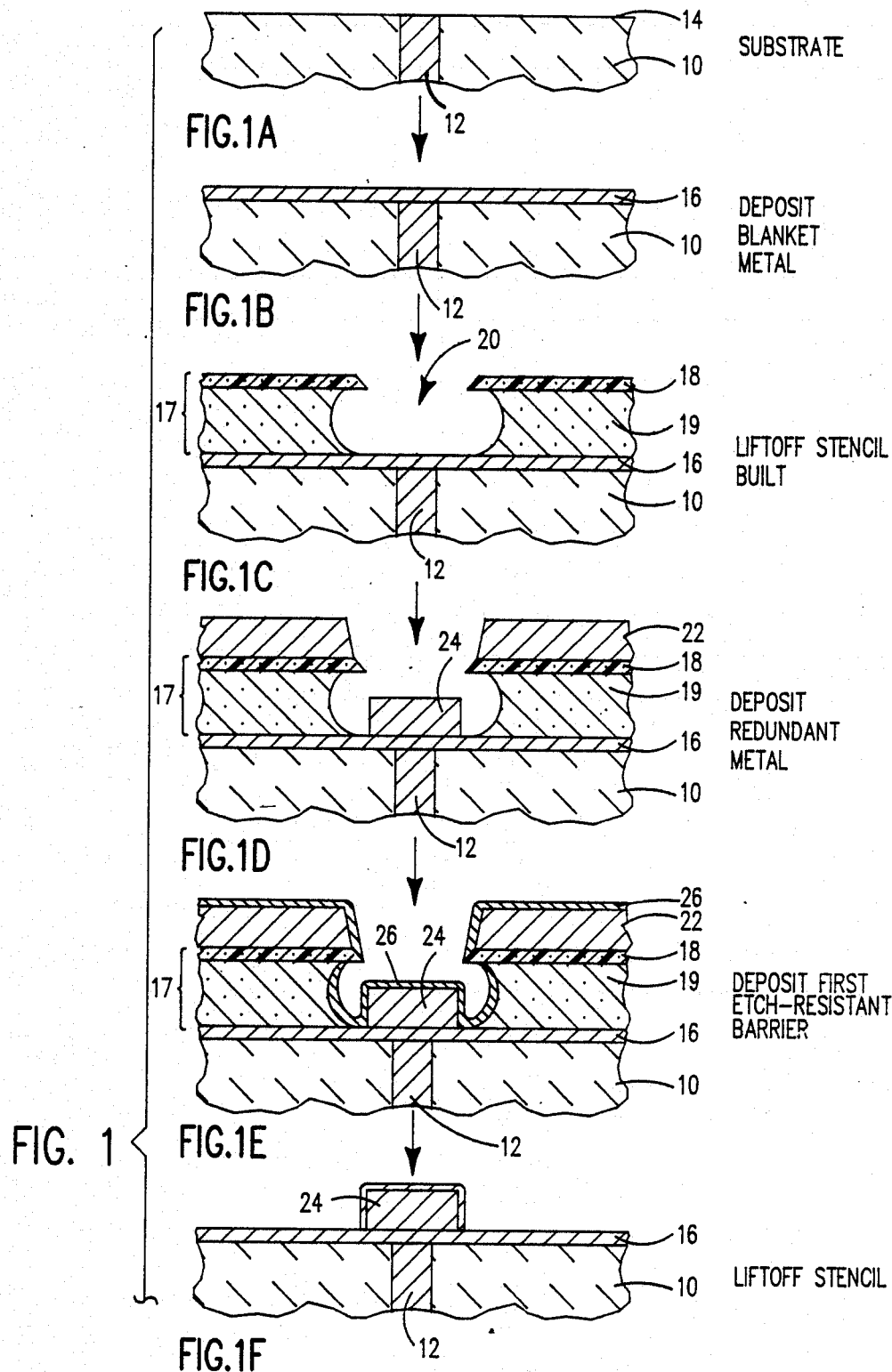

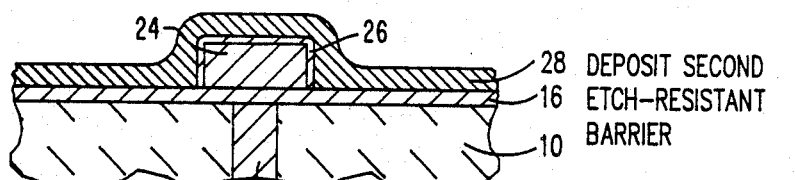
FIG.1G — DEPOSIT SECOND ETCH-RESISTANT BARRIER
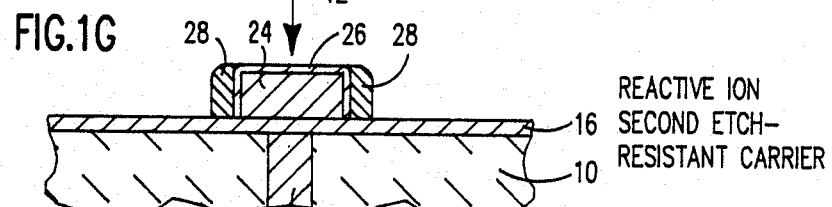
FIG.1H — REACTIVE ION SECOND ETCH-RESISTANT CARRIER
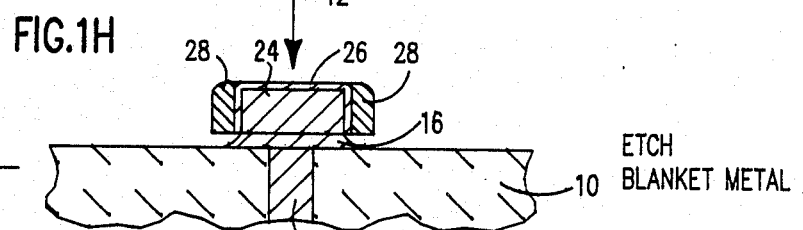
FIG.1I — ETCH BLANKET METAL
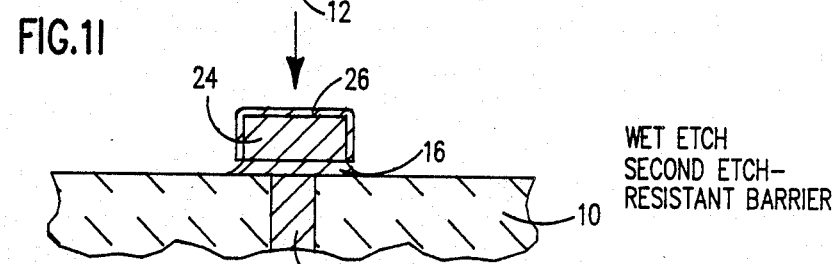
FIG.1J — WET ETCH SECOND ETCH-RESISTANT BARRIER
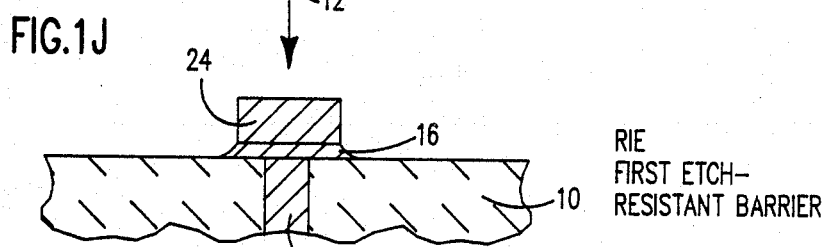
FIG.1K — RIE FIRST ETCH-RESISTANT BARRIER
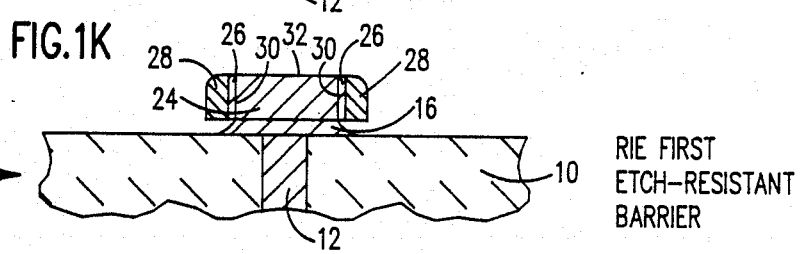
FIG. 1   FIG.1L — RIE FIRST ETCH-RESISTANT BARRIER

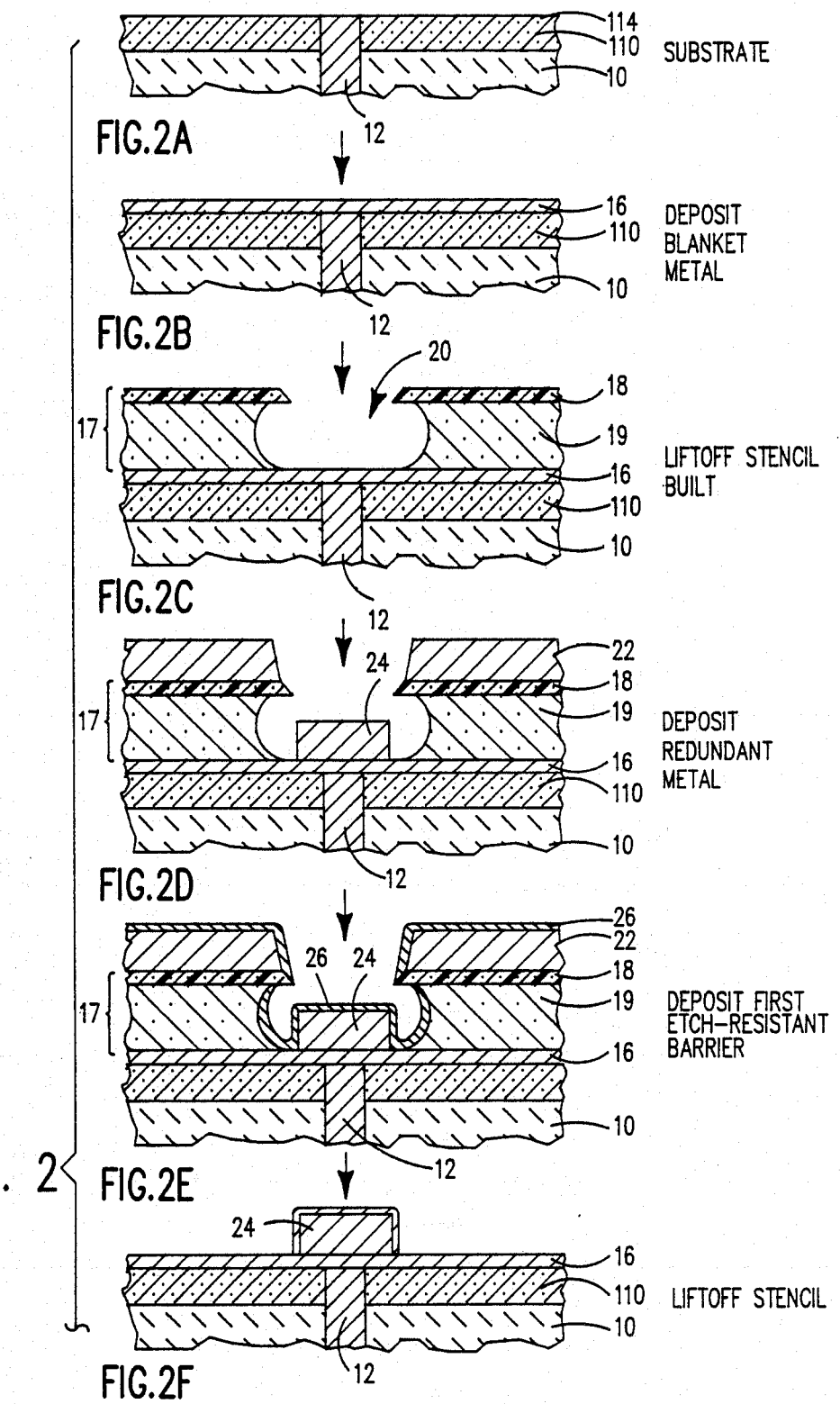

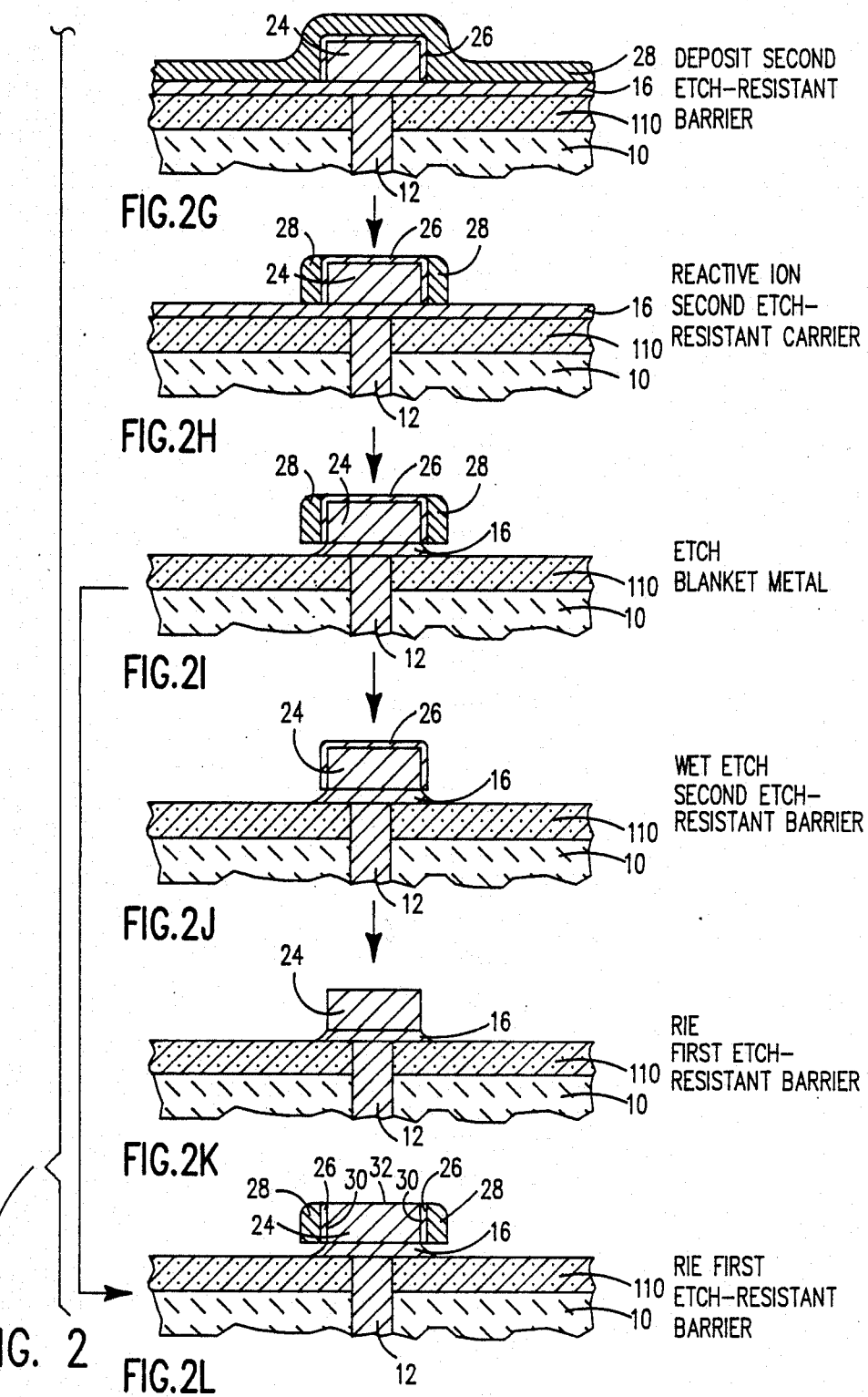

METHOD FOR PRODUCING A PLURALITY OF LAYERS OF METALLURGY

BACKGROUND OF THE INVENTION

The present invention relates to integrated circuit packaging and, more particularly, to a method of selectively depositing a plurality of metal layers on a ceramic substrate, particularly multi-layer ceramic (MLC) substrates.

It is well known to use ceramic substrates as supports for mounting semiconductor devices thereon. The present invention is concerned with all ceramic substrates but is of particular importance to MLC substrates. Accordingly, only MLC substrates will be referred to hereafter but it should be understood that the invention has applicability to ceramic substrates in general.

MLC technology for producing substrates for integrated circuit semiconductor package assemblies is well known in the art. Such substrates are produced by preparing a slurry of a suitable particulate ceramic, a resin binder material, a solvent for the resin binder, and generally a plasticizing agent, doctor blading the slurry on a beam and subsequently drying to form thin flexible sheets, commonly termed ceramic green sheets. These sheets are punched to form via holes, and the via holes are filled with a conductive paste and also formed into lines which will ultimately form the internal circuitry. The punched and printed green sheets are assembled into a laminated substrate and then sintered. The resultant substrate is capable of mounting many devices which are interconnected by the internal circuitry. External contact is made by a plurality of I/O pins on the opposite side. The substrate is provided on the top surface with many small pads which are suitable for making solder connections to corresponding device terminals.

Such MLC substrates require a relatively complex metallurgy on the topside to make connections to the integrated circuit devices and provide engineering change pads, and on the bottom to make connection to the I/O pads or other type connections. The complex metallurgy is comprised of several layers of metal which are selectively deposited in a predetermined pattern by additive and/or subtractive photolithographic processes such as those disclosed in, for example, Christensen et al. U.S. Pat. No. 4,526,859, Schmeckenbecher U.S. Pat. No. 4,206,254, IBM Technical Disclosure Bulletin, Vol. 27, No. 6, November 1984, pp. 3341-3342, and IBM Technical Disclosure Bulletin Vol. 26, No. 12, May 1984, p. 6624, all of which are incorporated by reference herein.

Osborne et al. teaches a subtractive process for use in conjunction with thin film magnetic heads. There, a first layer is encapsulated with a protective metal while a second layer is etched.

Notwithstanding the above known processes, there still remains a need for an improved process for selectively depositing a plurality of metallic layers.

Accordingly, it is an object of the invention to have an improved process for selectively depositing a plurality of metallic layers.

It is a further object of the invention to have an improved process for selectively depositing a plurality of metallic layers which is reliable in use.

It is another object of the invention to have an improved process for selectively depositing a plurality of metallic layers which is simpler in operation than known photolithographic processes.

These and other objects of the invention will become more apparent after referring to the following description considered in conjunction with the accompanying drawings.

BRIEF SUMMARY OF THE INVENTION

The objects of the invention have been achieved by providing in one aspect of the invention a method for selectively depositing a plurality of metal layers on a substrate. The method comprises the steps of depositing at least one layer of blanket metal on a surface of a substrate, building a lift-off stencil over the blanket metal, depositing at least one layer of redundant metal over the lift-off stencil, depositing a first etch-resistant barrier over the redundant metal, removing the lift-off stencil and the overlying layers of redundant metal and the etch-resistant barrier, depositing a second etch-resistant barrier over the blanket metal and the first etch-resistant barrier, and then reactive ion etching (RIE) the second etch-resistant barrier so as to expose the blanket metal and at least partially and selectively remove the second etch-resistant barrier from the first etch-resistant barrier. A final step of the method comprises etching the blanket metal.

According to another aspect of the invention, there is disclosed a metallurgical structure for a packaging substrate. The structure comprises a substrate, a via or stud protruding to a surface of the substrate, at least one layer of blanket metal on the surface of the substrate and overlying the via or stud, and at least one layer of redundant metal overlying the blanket metal. The redundant metal has an electrically isolating coating on its sides but is free of said coating on its top surface so as to be able to make electrical contact with an electrical component.

It must be noted that an important result of the present invention is that it allows the patterning of two distinct deposited layers, in particular those used for thin film redistribution, by using only one photolithographic mask and process. Previously, the patterning of two distinct deposited layers required two photolithographic steps and resulted in a structure that was inferior to the present one. The reason for the improved structure in the present invention is that, according to the invention, the blanket metal and redundant metal are self-aligned which is clearly not the case when two photolithographic steps are utilized.

BRIEF DESCRIPTION OF THE FIGURES

FIGS. 1A through 1L represent a schematical illustration of the method according to the invention.

FIGS. 2A through 2L represent a schematical illustration of an alternative embodiment of the method according to the invention.

DETAILED DESCRIPTION OF THE INVENTION

Referring to the Figures in more detail and more particularly referring to FIGS. 1A to 1L there is disclosed according to the invention a method for selectively depositing a plurality of metal layers on a substrate. The method comprises the steps of firstly providing a substrate 10 as shown in FIG. 1A. The substrate 10 may be a ceramic or alternatively, as will be discussed in more detail hereafter in conjunction with the embodiment of FIG. 2, may be a polymeric material. Preferably the ceramic is alumina (Al$_2$O$_3$) or a glass ceramic material such as that disclosed in Kumar et al., U.S. Pat. Nos. 4,301,324 and 4,413,061 the disclosures of which are incorporated by reference herein. As the preferred use of the invention is in conjunction with a multi-layer ceramic substrate the substrate 10 represents the top layer of a multi-layer ceramic substrate and may further comprise a via or stud (hereinafter both called a via) 12 protruding to the surface 14 of the substrate 10. The purpose of this via 12 is to make electrical contact between the surface 14 of the substrate 10 and the electrical circuitry below this layer of ceramic material.

The next step of the invention comprises depositing at least one layer of blanket metal on a surface of the substrate as shown in FIG. 1B. The blanket layer of metal 16 may be deposited by, for example, electron gun evaporation or sputter deposition. The blanket layer of metal 16 may be an alloy of aluminum and copper (1%) and have a thickness of about 2 microns. Preferably, however, the blanket layer of metal 16 is a tri-layer structure comprising chromium (about 200 Angstroms thick), copper (about 2 microns thick) and chromium (about 200 Angstroms thick), respectively. As is well known the blanket metal provides a low ohmic contact between the vias and the overlying metallurgy.

The next step in the process as shown in FIG. 1C is building the lift-off stencil, generally indicated by 17, over the blanket layer 16 and having selected open areas 20 through which the blanket metal 16 is exposed. Building the lift-off stencil 17 comprises the individual steps of first applying a layer of photoresist 18 over the blanket layer 16 and then image-wise exposing and developing the photoresist layer in predetermined areas so as to define a lift-off stencil having selected open areas 20 which are not covered by the photoresist 18. An intermediate polymeric layer 19 of, for example, polyimide is preferably applied prior to the application of the photoresist 18. While the intermediate polymeric layer 19 is preferred for the practice of the invention, it is not absolutely necessary and may be dispensed with if desired. Further, other materials may be substituted for the polyimide in the intermediate layer 19 as the situation may require. The building of the lift-off stencil may be accomplished by methods which are well known to those skilled in the art such as that illustrated in Agnihotri et al. U.S. Pat. No. 4,092,442, the disclosure of which is incorporated by reference herein.

From a practical standpoint, the lift-off stencil may be built in the following manner. A polyimide adhesion promotor is spin applied followed by spin applying about 12.5 microns of polyimide, then baked. A suitable resist (positive or negative) is then spin applied to a thickness of about 1.3 microns, then baked. The resist is exposed and developed and then exposed to ultraviolet radiation for resist hardening. The resist is baked again. Thereafter, the resist is silylated by immersing in a 10% HMCTS solution (hexamethylcyclotrisilazane in xylene) and then baked. The polyimide is removed in selected areas by reactive ion etching in an oxygen atmosphere.

Thereafter, the method comprises the depositing of at least one layer of redundant metal 22 over the lift-off stencil 17 and in the selected open areas 20 which are not covered by the stencil 17, as shown in FIG. 1D. Thus, as can be seen from the Figure the redundant metal 22 is blanket deposited over the lift-off stencil 17 and in the open areas 20 so as to form a stack of metal 24 in contact with the blanket metal 16. As shown in the Figures, the photoresist 18 is left in place when the redundant metal 22 is deposited. However, the photoresist 18 may be stripped after the lift-off stencil 17 is built and prior to the deposition of the redundant metal 22.

Most preferably, the redundant metal 22 is directionally deposited, perpendicular (i.e. vertical) to the substrate surface 14. The preferred deposition technique is electron gun evaporation. Such vertical redundant metallization techniques utilize a plurality of metallization depositions to replace any single metallization deposition to reduce the chances of voids or opens in the metallization pattern. Typically, conductor patterns are deposited in two separate steps so that a parallel conductive metallization structure will exist over or below any voids or opens present in either single pattern. This metallization technique is very successful in reducing or eliminating voids or opens because the probability of random voids or opens that are formed in either of the distinct pattern layers overlying is minimal. This dramatically increases the processing yields and reliability of the package. The vertical redundant metallization technique has numerous packaging applications in which thin film metallization may be used. For example, state of the art multi-layer ceramic packages incorporate thin film redistribution structures such as those described in U.S. Pat. No. 4,221,047. The purpose of the thin film redistribution is threefold. Firstly, it electrically connects the MLC substrate and the semiconductor devices. Secondly, it creates EC (engineering change) pads for wire bonding for chip to chip connections and for laser delete straps. Finally, the thin film redistribution fans out the dense C-4 (solder ball) microsocket patterns to less dense arrays from which electrical signals go into the substrate and to EC pads. Thus, to increase the yields of multi-layer ceramic packages having thin film redistribution structures incorporated therein, the vertical redundant metallization technique described herein may be used to successfully increase yields and also reliability.

It is necessary that the redundant metal have good adhesion to the blanket metal as well as good electrical conducting properties as the redundant metal forms contacts to C-4s, EC wire bonds, bus bars as well as other thin film lines. It has been found that a preferred combination of metals for the redundant metal comprises a multi-layer structure of chromium (about 0.02 microns thick), copper (about 4 microns thick), nickel (about 2 microns thick) and gold (about 0.15 microns thick for C-4s and about 1.0 microns thick for EC wire bonding pads), respectively. An optional layer of chromium (about 0.2 microns thick) may also be deposited over the gold for the formation of a C-4 solder dam.

Continuing with the method the next step is to deposit a first etch-resistant barrier 26 over the redundant metal structure 22, 24 as shown in FIG. 1E. It is preferred that this first etch-resistant barrier comprises hexamethyldisilazane (HMDS) having a thickness of about 1 micron. The importance of this first etch-resistant barrier will become apparent hereafter. The HMDS is usually deposited by plasma deposition techniques. It is important that the etch-resistant barrier form a conformal coating which follows the surface contours and also deposits on the sidewalls of the redundant metal stack 24. The first etch-resistant barrier 26 should also be pin-hole free as well as insoluble in solvents which are used to lift-off the stencil. It has been found that the HMDS is a preferred material for these reasons. However, it is believed that other materials will also suffice, such as, silicon nitride, aluminum oxide and tungsten.

The next step in the method is to remove the lift-off stencil 17 and the overlying layers of redundant metal 22 and the overlying first etch-resistant barrier 26 so that the structure now appears as shown as FIG. 1F. The lift-off stencil 17 may be removed by a suitable solvent, such as N-methyl pyrilodone (NMP). As is apparent, the redundant metal stack 24 is encapsulated by a conformal coating of the first etch resistant barrier 26.

At this point in the process a second etch-resistant barrier 28 is deposited over the blanket metal 16 and the first etch-resistant barrier 26. It is necessary that this second etch-resistant barrier also provide a conformal coating over the structure as shown in FIG. 1G. Further, it is necessary that the second etch-resistant barrier be pin-hole free so as to protect the underlying metal from a subsequent etching step. As can be appreciated from FIG. 1G the second etch-resistant barrier 28 encapsulates the redundant metal stack 24 and the blanket metal 16. A preferred material for the second etch-resistant barrier 28 is silicon dioxide ($SiO_2$) which may be plasma deposited to a thickness of about 2 microns. It is believed that silicon nitride will also be suitable for the second etch-resistant barrier.

The second etch-resistant barrier 28 is then reactive ion etched so as to expose the blanket metal 16 (except for that portion covered by redundant metal stack 24) and at least partially and selectively remove the second etch-resistant barrier 28 from the first etch-resistant barrier 26 as shown in FIG. 1H. It is preferred to reactive ion etch the second etch-resistant barrier, when it is silicon dioxide, with carbon tetrafluoride ($CF_4$) which etches directionally. An end-point detector, an interferometer, measures on the blanket metal layer 16 the point at which the second etch-resistant barrier 28 is etched through. The directional etching removes the second etch-resistant barrier 28 from the top surface of the first etch-resistant barrier and from the blanket metal layer 16 but leaves a sidewall formation of the second etch-resistant barrier 18. The first etch-resistant barrier 26 is left intact since the etching was stopped just after the second etch-resistant barrier 28 was removed.

The blanket metal 16 is then etched with a suitable etching medium to give the resulting structure as shown in FIG. 1I. The final structure or shape of the blanket metal 16 is defined by the redundant metal stack 26 and the sidewalls of the first 26 and second 28 etch-resistant barriers. Wet etching may be utilized if the blanket metal is the chrome, copper, chrome tri-layer structure discussed earlier. Each of the chrome layers may be conveniently etched in a potassium permanganate solution while the copper layer may be conveniently etched with a solution of ammonium persulfate and cupric sulfate.

If the blanket metal is the aluminum alloy the etching may be accomplished by reactive ion etching or wet etching. A convenient wet etch for the aluminum alloy is a phosphoric acid or sodium hydroxide solution while RIE of the alloy is possible with a mixture of boron trichloride, trichlomethane and nitrogen.

At this point in the process two alternative routes may be taken. The first route as shown in FIGS. 1J and 1K is to wet etch the second etch-resistant barrier 28 so as to remove the remaining part thereof, i.e., the sidewalls. If the second etch-resistant barrier 28 is silicon dioxide the stripping thereof may be simply accomplished by a dip-etch in buffered hydrofluoric acid. Thereafter the first etch-resistant barrier 26 is reactive ion etched. If the first etch-resistant barrier is HMDS reactive ion etching may be easily accomplished in carbon tetrafluoride.

Alternatively, the first etch-resistant barrier 26 may be simply reactive ion etched while leaving the second etch-resistant barrier 28 in place as shown in FIG. 1L. In this case, the wet etching step to remove the second etch-resistant barrier 28 is omitted.

An advantage of leaving the first etch-resistant barrier in place, as shown in FIG. 1L, is that it provides corrosion protection for the deposited metal during subsequent processing and use. An additional advantage is that the first etch-resistant barrier electrically isolates the deposited metal from its nearest neighbors, thereby permitting higher packing density.

It is a condition of the invention that the second etch-resistant barrier 28 does not etch under the same conditions that etched the first etch-resistant barrier 26. Thus, the second etch-resistant barrier 28 acts as a masking layer that protects the sidewall material from etching. However, the first etch-resistant barrier on top of the redundant metal stack 24 is etched off so that electrical contact can be made to the redundant metal. It must be appreciated then that it is necessary to very carefully choose the materials of the first and second etch-resistant barriers so as to obtain the desirable properties discussed earlier as well as to have materials that have different etching rates. This is also true with respect to the first alternative embodiment in FIGS. 1J and 1K since it is necessary to remove the second etch-resistant barrier 28 without otherwise affecting the first etch-resistant barrier 26.

Referring now to FIG. 2 there is shown an alternative embodiment of the method according to the invention. In FIG. 2A the substrate 110 in this case is a polymeric material which may or may not be layered over a ceramic substrate 10. If there is a ceramic substrate the ceramic may be alumina or glass ceramic as discussed previously. Further, the via 12 extends upwardly through the polymeric materials so as to reach the surface 114 of the polymeric material. Preferably, the polymeric material is a polyimide. Aside from the different substrate 110, the method according to this embodiment of the invention proceeds exactly as discussed with respect to FIG. 1.

The method according to the invention leads to an important metallurgical structure shown in FIGS. 1L and 2L. In this aspect of the invention, the substrate 10(110) has a via 12 protruding to a surface 14(114) of the substrate 10(110). There is at least one layer of blanket metal, as discussed previously, on the surface 14(114) of the substrate 10 (110) and overlying the via 12. There is additionally at least one layer of redundant metal 24, as also discussed previously, overlying the blanket metal. An important feature of the present invention is that the widths of the blanket metal and the redundant metal in the final metallurgical structure are nearly the same, as shown in FIGS. 1K, 1L, 2K and 2L.

As shown in FIGS. 1L and 2L, the redundant metal 24 has an electrically isolating coating 29 on its sides 30. As is evident, the electrically isolating coating 29 may be made up of first 26 and second 28 etch-resistant barriers. It should, however, be understood that the electrically isolating coating 29 is not limited to the first 26 and second 28 etch-resistant barriers and may, in fact, include other layers of material (not shown). Alternatively, an electrically isolating coating may also be obtained (although not the preferred mode) by removing just the second etch-resistant barrier 28 and leaving the first etch-resistant barrier 26 in place.

Finally, the redundant metal 24 is free of the electrically isolating coating 29 on its top surface 32. This allows the redundant metal 24 to make electrical contact with an electrical component such as a C-4 solder ball or an EC jumper wire.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A method for selectively depositing a plurality of metal layers on a substrate, comprising the steps of:
   (a) providing a substrate;
   (b) depositing at least one layer of blanket metal on a surface of the substrate;
   (c) building a lift-off stencil over the blanket metal, said lift-off stencil having selected open areas through which the blanket metal is exposed;
   (d) depositing at least one layer of redundant metal over the lift-off stencil and in the selected open areas;
   (e) depositing a first etch-resistant barrier over the redundant metal;
   (f) removing the lift-off stencil and the overlying layers of redundant metal and the overlying first etch-resistant barrier;
   (g) depositing a second etch-resistant barrier over the blanket metal and the first etch-resistant barrier;
   (h) reactive ion etching the second etch-resistant barrier so as to expose the blanket metal and at least partially and selectively remove the second etch-resistant barrier from the first etch-resistant barrier; and
   (i) etching the blanket metal.

2. The method of claim 1, wherein the first etch-resistant barrier comprises hexamethyldisilizane (HMDS).

3. The method of claim 1, wherein the second etch-resistant barrier comprises silicon dioxide ($SiO_2$).

4. The method of claim 1 further comprising the step of reactive ion etching the first etch-resistant barrier so as to expose the redundant metal.

5. The method of claim 1 further comprising the step of wet etching the second etch-resistant barrier so as to remove the remaining part thereof.

6. The method of claim 5 further comprising the step of reactive ion etching the first etch-resistant barrier so as to expose the redundant metal.

7. The method of claim 1, wherein the substrate is a ceramic.

8. The method of claim 7, wherein the ceramic is alumina ($Al_2O_3$).

9. The method of claim 7, wherein the ceramic is a glass ceramic.

10. The method of claim 1, wherein the substrate is a polymeric material.

11. The method of claim 10, wherein the polymeric material is polyimide.

12. The method of claim 1, wherein the blanket metal comprises layers of chromium, copper and chromium, respectively.

13. The method of claim 1, wherein the blanket metal comprises an aluminum/copper alloy.

14. The method of claim 1, wherein the redundant metal comprises layers of chromium, copper, nickel and gold, respectively.

* * * * *